United States Patent
De Araújo Borges Montezuma De Carvalho et al.

(10) Patent No.: US 12,107,554 B2
(45) Date of Patent: Oct. 1, 2024

(54) DIGITAL CONTROLLED MULTI STAGE SMART COMBINER

(71) Applicant: UNIVERSIDADE NOVA DE LISBOA, Lisbon (PT)

(72) Inventors: Paulo Miguel De Araújo Borges Montezuma De Carvalho, Caparica (PT); Rui Miguel Henriques Dias Morgado Dinis, Caparica (PT); João Pedro Abreu De Oliveira, Caparica (PT)

(73) Assignee: UNIVERSIDADE NOVA DE LISBOA, Lisbon (PT)

( * ) Notice: Subject to any disclaimer, the term of this patent is extended or adjusted under 35 U.S.C. 154(b) by 559 days.

(21) Appl. No.: 17/284,721

(22) PCT Filed: Oct. 11, 2019

(86) PCT No.: PCT/PT2019/000008
§ 371 (c)(1),
(2) Date: Apr. 12, 2021

(87) PCT Pub. No.: WO2020/076172
PCT Pub. Date: Apr. 16, 2020

(65) Prior Publication Data
US 2021/0359651 A1   Nov. 18, 2021

(30) Foreign Application Priority Data
Oct. 11, 2018   (PT) .......................... 115072

(51) Int. Cl.
H03F 3/21        (2006.01)
(52) U.S. Cl.
CPC ........ H03F 3/211 (2013.01); *H03F 2200/102* (2013.01); *H03F 2200/336* (2013.01); *H03F 2200/451* (2013.01)

(58) Field of Classification Search
CPC ............... H03F 3/211; H03F 2200/451; H03F 2200/102; H03F 2200/336; H03F 1/0294;
(Continued)

(56) References Cited

U.S. PATENT DOCUMENTS

| | | |
|---|---|---|
| 3,777,275 A | 12/1973 | Cox |
| 3,927,379 A | 12/1975 | Cox |

(Continued)

FOREIGN PATENT DOCUMENTS

| | | |
|---|---|---|
| EP | 1469649 A1 | 10/2004 |
| EP | 3306816 A1 | 4/2018 |
| JP | 6242548 B1 | 12/2017 |

OTHER PUBLICATIONS

T.S. Rappaport, et al., Milimeter wave mobile communications for 5g cellular: it will work, [in:] Access, IEEE, vol. 1, pp. 335-249, 2013.

(Continued)

*Primary Examiner* — Andrea Lindgren Baltzell
*Assistant Examiner* — Khiem D Nguyen
(74) *Attorney, Agent, or Firm* — Leason Ellis LLP

(57) ABSTRACT

Circuits and methods for use in amplifying amplitude and phase modulated signals. A circuit uses a digital controlled multi stage combiner, a signal phase discrete mapper and a combiner digital control circuit with N parallel signal feeding it. The signals resulting from N power amplifiers have phases with belonging to an alphabet with M discrete phases prior to being fed to the multi stage combiner. The phases of the N input signals are converted in an control signal generator into Ns sets of digital control signals to control N·M sets of switches where the signals are selected according the phase and sent to the corresponding combiner in the M possible combiners. Each one combiner from the set of M combiner then combines these signals. A second stage with (Continued)

digital controlled combiner, combines into two sub-sets of signals the signals resulting from first stage and the resulting outputs of the combiner are then combined by a third combining digital controlled stage into the output signal. The signal amplifiers employed before the combining stage may be Class D or Class F amplifiers to provide high efficiency amplification of the signals.

16 Claims, 6 Drawing Sheets

(58) Field of Classification Search
CPC ......... H03F 2203/21145; H03F 3/2178; H03F 3/24; H03F 1/32
USPC .................................... 330/295, 51, 124 R
See application file for complete search history.

(56) References Cited

U.S. PATENT DOCUMENTS

| | | | |
|---|---|---|---|
| 5,304,943 | A | 4/1994 | Koontz |
| 6,359,504 | B1 * | 3/2002 | Cozzarelli ............. H03F 1/3229 330/136 |
| 7,260,368 | B1 | 8/2007 | Blumer |
| 7,889,811 | B2 | 2/2011 | Byun et al. |
| 8,451,053 | B2 | 5/2013 | Perreault et al. |
| 10,069,467 | B1 | 9/2018 | Carvalho et al. |
| 2013/0021104 | A1 | 1/2013 | Schmidt |
| 2016/0164466 | A1 | 6/2016 | Briffa et al. |
| 2018/0138862 | A1 | 5/2018 | Balteanu et al. |

OTHER PUBLICATIONS

S. Rangan, T.S. Rappaport, E. Erkip, Millimeter-wave cellular wireless networks: potentials and challenges, [in:] Proceedings of the IEEE, vol. 102, pp. 366-385, Mar. 2014.
D. Falconer, S. Ariyavisitakul, A. Benyamin-Seeyar, B. Eidson, Frequency Domain Equalization for Single-Carrier Broadband Wireless Systems, [in:] IEEE Comm. Mag., vol. 4, No. 4, pp. 58-66, Apr. 2002.
R. v. Nee, R. Prasad, OFDM for Wireless Multimedia Communications, 1st ed. Norwood, MA, USA: Artech House, Inc., 2000.
Hsiao-Hwa Chen, The next generation of CDMA techniques, John Wiley & Sons, 2007.
N. Benvenuto, R. Dinis, D. Falconer, S. Tomasin, Single carrier modulation with nonlinear frequency domain equalization: An idea whose time has come—Again, [in:] Proceedings of the IEEE, vol. 98, No. 1, pp. 69-96, 2010.
R. Dinis, P. Montezuma, N. Souto, J. Silva, Iterative Frequency-Domain Equalization for General Constellations, 33rd IEEE Sarnoff Symposium 2010, Princeton, USA, Apr. 2010.
L. Zhang, L.-L. Kuang, Z.-Y. Ni, J.-H. Lu, Performance evaluation for OFDM and SC-FDE systems with high power amplifier, [in:] IET International Communication Conference on Wireless Mobile and Computing (CCWMC 2009), pp. 348-352, Dec. 2009.
R. Wolf, F. Ellinger, R. Eickhoff, On the maximum efficiency of power amplifiers in OFDM Broadcast Systems with Envelope Following, [in:] proc. Of Mobilight 2010: Mobile Lightweight Wireless Systems, pp. 160-170. 2010.
O. A. Gouba, Y. Louet, Theoretical analysis of the trade-off between efficiency and linearity of the High Power Amplifier in OFDM context, EW 2012, Poznań, Poland, Apr. 2012.
M. Bellanger, FBMC physical layer: A primer, [in:] ICT-PHYDYAS, Tech. Rep., pp. 1-31, 2010.
D. Cox, Linear amplification with nonlinear components, [in:] IEEE Transactions on Communications, vol. 22, No. 12, pp. 1942-1945, Dec. 1974.
A. Birafane, M. El-Asmar et al., Analyzing LINC Systems, [in:] Microwave Magazine, IEEE, vol. 11, No. 5, pp. 59-71, Aug. 2010.
R. Dinis, A. Gusmão, Nonlinear signal processing schemes for OFDM modulations within conventional or LINC transmitter structures, [in:] European Transactions on Telecommunications, Vo. 19, No. 3, pp. 257-271, Apr. 2008.
T. W. Barton, D. J. Perreault, Theory and Implementation of RF-Input Outphasing Power Amplification, [in:] IEEE Transactions on Microwave Theory and Techniques, vol. 63, No. 12, pp. 4273-4283, Dec. 2015.

* cited by examiner

DIGITAL CONTROLLED MULTI STAGE SMART COMBINER

CROSS-REFERENCE TO RELATED APPLICATIONS

This application is a U.S. National Stage Application under 35 U.S.C. § 371 of International Patent Application No. PCT/PT2019/000008, filed Oct. 11, 2019, which claims priority to Portugal Patent Application No. 115072, filed Oct. 11, 2018, which are hereby incorporated by reference in their respective entireties.

BACKGROUND OF THE INVENTION

Field of the Invention

The present invention relates to arrangements of power combining for paralleling amplifier structures for increased output power. More particularly, the present invention relates to digital controlled cascade power parallel combining structure which combines sequentially sub-sets of signals selected according the phase values and digital control information and controls the power of each combiner according the power level needed at the output.

Description of Related Art

The demand of high spectral and high power efficiencies characterizes modern communications systems [1, 2]. This is especially important for high and very high bit rate communication systems where spectral efficiency can be achieved by a single carrier (SC) signal or multi-carrier (MC) modulations based on large constellations. However, high spectral efficiencies (i.e., large constellations), are also associated to signals with high envelope fluctuations and high peak-to-average power ratio (PAPR), which can compromise power amplification efficiency [3]. This makes crucial the efficiency of a radio frequency (RF) power amplifier due to the significant impact on the battery life of a portable device, such as a portable transmitter, because the amplifier typically consumes the most amount of power used by the device. Unfortunately, the traditional tradeoff between linearity and efficiency in power amplifiers (PAs) is such that the more linear a power amplifier is the less power efficient it is. For example, the most linear amplifier is biased for class A operation, which is the least efficient class of amplifiers. High power efficiency could be achieved by class C, D, E, F and S PAs, but non linear of these PAs could result in spectrally distorted output signals with high PAPR values. However, many recent transmitter designs require a non-constant amplitude RF output to maximize the data rate within a given channel bandwidth. A suitable linear RF amplifier may be manufactured using gallium arsenide (GaAs) devices. However, gallium arsenide devices are presently considered too expensive for many applications. While metal-oxide-semiconductor (MOS) is the preferred process for manufacturing semiconductor devices, due to its low cost of fabrication and high yields, MOS has traditionally been unsuitable for fabricating linear RF amplifiers due to its lack of linearity when used to implement a high efficiency amplifier. Such poor linearity introduces a significant amount of distortion into the amplifier's output signal.

Due to signals' PAPR, PAs are often required to provide linear amplification, which encompasses the ability to dynamically control an RF output power over a wide range. This becomes particularly challenging when wide-bandwidth control of an output signal is required. It is also often desired to maintain high efficiency across a wide range of output power levels, such that high average efficiency can be achieved for highly modulated output waveforms. The tradeoff between linearity and efficiency in power amplifiers is further accentuated by modern wired and wireless communications systems with strictly requirements regarding spectral and power efficiencies. For example, wireless communication signals, such as orthogonal frequency-division multiplexing (OFDM) [4], coded division multiple access (CDMA) [5], wide band CDMA (W-CDMA), single carrier with frequency domain equalization (SC-FDE) [6, 7, 8] and orthogonal Frequency division multiple access (OFDMA), are characterized by envelope fluctuations and high PAPR values, which may compromise amplification efficiency [1, 9, 10, 11]. The larger the signal's PAPR the more non-linear distortion will be produced when non-linear amplifiers are employed. Other multi-carrier techniques such as filter bank multi-carrier with offset quadrature amplitude modulation (FBMC-OQAM) have same drawback [12].

Generically, modulated signals can be described by $s(t)=s_I(t) \cos(w_c t)+j\, s_Q(t) \sin(w_c t)$, where $w_c=2\pi f_c$ denotes the angular frequency, $f_c$ denotes the carrier frequency, and $s_I(t)$ and $s_Q(t)$ denote the in-phase and the quadrature component, respectively. The signal can be also described in terms of its complex envelope by $s(t)=\operatorname{Re}\{\tilde{s}(t)e^{jw_c t}\}$, where $\tilde{s}(t)=s_I(t)+j s_Q(t)$ denotes the complex envelope, with the signal envelope given by $e(t)=\sqrt{(s_I(t))^2+(s_Q(t))^2}$. When $e(t)$ is constant or quasi constant along time a signal is said as constant envelope signal. Time varying envelope signal refers a signal where $e(t)$ shows amplitude variations with time. Having both non-constant envelope and phase, $s(t)$ is said to be a time-varying complex envelope signal. The dynamic range (DR) of the envelope represents the range of values between which the signal's envelope varies.

In a time varying envelope signal the envelope values may assume any value inside the DR of the envelope, which means that the number of possible values for the envelope will be infinite. Without a discretization of the possible magnitude values of the time varying envelope, a technique referred as outphasing or as linear amplification with non-linear components (LINC) technique [13-18] can be applied to obtain the decomposition into two or more constant magnitude phasors with appropriately specified phase shifts relative to a reference phasor.

In the documents [13-18] a LINC is disclosed. Also, documents and disclose amplification processes based on the same principle. This technique separates the input signal $s(t)$ in two constant envelope signals to be amplified separately by two highly efficient non linear (NL) amplifiers (e.g., class D and E amplifiers). In conventional LINC, an input signal $S(t)$ with a time varying envelope is decomposed into two constant amplitude signals $S_1(t), S_2(t)$ which can be summed to provide a desired output signal $S_{out}(t)$. A time varying envelope output signal is created as the sum of two constant-envelope signals $S_1(t), S_2(t)$ by outphasing of the two constant envelope signals. Because the two signals $S_1(t), S_2(t)$ are of constant amplitude, they can be synthesized by PAs of classes D, E, F, E/F and current-mode D, Inverse F, ¢, etc. Combining the two constant amplitude outputs $S_1(t), S_2(t)$ in a power combining network enables the net output amplitude to be controlled via the relative phase of the two constituent components $S_1(t), S_2(t)$. This also means that LINC transmitter scheme is limited by the envelope characteristics of its input signal. Since the amplitude information of the band-limited signal is embedded in the phase of the LINC components, a highly fluctuating envelope produces a constant envelope LINC component with high phase content, which is what causes the LINC components' spectrum to spread.

Another problem related with LINC is how the power combining is done, particularly because many high-efficiency power amplifiers are highly sensitive to load impedance, and their performance and efficiency can heavily degrade due to interactions between the power amplifiers. In outphasing, one conventional approach is to combine the constant-amplitude signals $S_1(t)$, $S_2(t)$ using an isolating combiner. An isolating combiner provides constant resistive loading impedance to each PA independent of the outphasing angle, eliminating any interactions. A consequence of this, however, is that each PA operates at a constant output power level. Power that is not delivered to the output must instead be delivered elsewhere, usually to an "isolation" resistor R which dissipates power in the form of heat. Thus, a portion of the total constant output power from the PAs is delivered to the sum port of the combiner, and the remainder is delivered to the difference port and is lost as heat in the isolation resistor. This leads to a rapid degradation of efficiency as output power is decreased, diminishing the attractiveness of this approach. This problem can be partially offset by recovering power not delivered to the output through a rectifier. Thus, in some implementations, power not delivered to the output is instead recovered back to the dc supply via a rectifier.

A different approach is to use a lossless combiner, such as a Chireix non-isolating combiner or related methods [21]. It is important to mention that we refer to a lossless combiner, as a combiner including only reactive components or energy storage components such that ideally there would be no loss, while recognizing that all real components have some degree of loss. We also refer as lossless combiner a reactive combiner. Benefits of the Chireix combining technique, which is, include the fact that the combiner is ideally lossless, and that the real components of the effective load admittances seen by the individual power amplifiers vary with outphasing (and power delivery) such that power amplifier conduction losses can be reduced as output power reduces. Even though the reactive impedances of the combiner compensate the effective reactive loading on the PAs, due to interactions between them, problems may arise on efficiency because the effective reactive loading due to PA interactions depends upon outphasing angle, and the compensation is imperfect over most of the operating range. This can thus lead to loss of efficiency and PA degradation when operating over wide ranges. This fact justifies why outphasing is not a dominant architecture in RF applications.

A different approach can be implemented by a digital controlled power combiner that combines a set of constant amplitude signals with discrete phases that may result from a discretization of the signal envelope, which can be performed by a quantization process. Through the quantization the infinite set of envelope values could be restricted to a finite set of quantizer values or symbols $\mathfrak{S}=\{s_0, s_1, \ldots, s_{N_{QL}-1}\}$, where $N_{QL}$ denotes the number of quantization levels, i.e. the size of the alphabet of quantization symbols. Let denote as $s(nT_s)=s_n$ the time domain sample of the time-varying envelope signal at the sample instant $nT_s$ and $s_I(nT_s)=s_{n,I}$ and $s_Q(nT_s)=s_{n,Q}$ the corresponding in-phase and quadrature components. Representing the quantization symbols as a sum of complex components the phases of the resulting signals belong to a discrete and limited alphabet $\xi=\{\phi_0, \phi_1, \ldots, \phi_M\}$. This means that it is possible to do the decomposition of the envelope of the input signal into several bi-phase shift keying (BPSK), or quadrature phase shift keying (QPSK), or offset QPSK (OQPSK), or minimum shift keying (MSK) or Gaussian minimum shift keying (GMSK) or other constant amplitude signals with discrete phases, in which the quantized values of the samples $s(t=nT_s)=s(n)$ of the complex envelope of a SC signal or signal are decomposed [22]. It also means that the reactive impedances of the combiner can compensate for the effective reactive loading on the PAs due to interactions between them, since the effective reactive loading due to interactions pairs of PAs associated to pairs of constant amplitude signals with discrete phases could be optimized for a fixed phase angle, avoiding imperfections on compensation due angle variations over an operating range as in classical outphasing systems.

It would, therefore, be desirable to provide a digital controlled power combining based on the phase discretization and digital information generated due to the quantization of the signal envelope for use in RF applications that overcomes the loss and reactive loading problems of previous outphasing combining approaches by providing ideally lossless power combining, enabling high average efficiency to be achieved even for large PAPR values.

INFORMATION DISCLOSURE STATEMENTS

Patents and publications relevant to the patentability of the instant claims, concerning a quantizer based amplification method.

[1] T. S. Rappaport, et al., "Millimeter wave mobile communications for 5g cellular: it will work!", Access, IEEE, vol. 1, no., pp. 335-349, 2013.
[2] S. Rangan, T. S. Rappaport, and E. Erkip, "Millimeter-wave cellular wireless networks: potentials and challenges", Proceedings of the IEEE, vol. 102, no. 3, pp. 366-385, March 2014.
[3] D. Falconer, S. Ariyavisitakul, A. Benyamin-Seeyar, and B. Eidson, "Frequency Domain Equalization for Single-Carrier Broadband Wireless Systems", IEEE Comm. Mag., vol. 4, no. 4, pp. 58-66, April 2002.
[4] R. v. Nee and R. Prasad, OFDM for Wireless Multimedia Communications, 1st ed. Norwood, MA, USA: Artech House, Inc., 2000.
[5] Hsiao-Hwa Chen, The next generation of CDMA techniques, John Wiley & Sons, 2007.
[6] D. Falconer, S. Ariyavisitakul, A. Benyamin-Seeyar, and B. Eidson, "Frequency Domain Equalization for Single-Carrier Broadband Wireless Systems", IEEE Comm. Mag., vol. 4, no. 4, pp. 58-66, April 2002.
[7] N. Benvenuto, R. Dinis, D. Falconer, and S. Tomasin, "Single carrier modulation with nonlinear frequency domain equalization: An idea whose time has come-Again", Proceedings of the IEEE, vol. 98, n. 1, pp. 69-96, 2010.
[8] R. Dinis, P. Montezuma, N. Souto, and J. Silva, "Iterative Frequency-Domain Equalization for General Constellations", 33rd IEEE Sarnoff Symposium 2010, Princeton, USA, April 2010.
[9] L. Zhang, L.-L. Kuang, Z.-Y. Ni, and J.-H. Lu, "Performance evaluation for OFDM and SC-FDE systems with high power amplifier", in IET International Communication Conference on Wireless Mobile and Computing (CCWMC 2009), December 2009, pp. 348-352.
[10] Robert Wolf, Frank Ellinger, and Ralf Eickhoff, "On the Maximum Efficiency of Power Amplifiers in OFDM Broadcast Systems with Envelope Following", in proc. of Mobilight 2010: Mobile Lightweight Wireless Systems, pp. 160-170.

[11] O. Abel Gouba, Yves Louet, "Theoretical analysis of the trade-off between efficiency and linearity of the High Power Amplifier in OFDM context", EW 2012, April 2012, Poznan, Poland, 2012.

[12] M. Bellanger, "FBMC physical layer: A primer" ICT-PHYDYAS, Tech. Rep., 2010, pp. 1-31.

[13] D. Cox, "Linear amplification with nonlinear components", IEEE Transactions on Communications, vol. 22, no. 12, pp. 1942-1945, December 1974.

[14] A. Birafane, M. El-Asmar et al., "Analyzing LINC Systems", Microwave Magazine, IEEE, vol. 11, no. 5, pp. 59-71, August 2010.

[15] R. Dinis and A. Gusmão, "Nonlinear signal processing schemes for OFDM modulations within conventional or LINC transmitter structures", European Transactions on Telecommunications, vol. 19, no. 3, pp. 257-271, April 2008.

[16] T. W. Barton and D. J. Perreault, "Theory and Implementation of RF-Input Outphasing Power Amplification", IEEE Transactions on Microwave Theory and Techniques, vol. 63, no. 12, pp. 4273-4283, December 2015.

[17] D. Cox, "Linear amplification with nonlinear devices", U.S. Pat. No. 3,777,275 A, December 1973.

[18] D. Cox Donald Clyde, R. E Langseth, O. J. D Reudink, A. J. Rustako Jr, "Linear amplification using nonlinear devices and inverse sine phase modulation", U.S. Pat. No. 3,927,379 A, December 1975.

[19] Sangjin Byun, Kwanwoo Kim, Kyutae Lim, Chang-Ho Lee, Haksun Kim, Joy Laskar, "Digital linear amplification with nonlinear components (LINC) transmitter", U.S. Pat. No. 7,889,811 b2, Feb. 15, 2011.

[20] Benny Blumer, "Linear amplification with non-linear components (LINC) modulator and method for generating out-phased signals for a LINC transmitter", U.S. Pat. No. 7,260,368 b1, Aug. 21, 2007.

[21] David J. Perreault, Alexander S. Jurkov, "Radio-frequency (RF) amplifier circuits and related techniques", U.S. Pat. No. 8,451,053 B2, May 28, 2013.

[22] P. Carvalho, R. Dinis, M. Beko, J. Guerreiro, and P. Viegas, "Quantized digital controlled amplification", U.S. Ser. No. 10/069,457, August 2018.

BRIEF SUMMARY OF THE INVENTION

The multi stage digital controlled power combining system, uses a digital controlled combiner, a signal phase discrete mapper and a combiner digital control circuit with N parallel signals feeding it. The signals from the power amplifiers have M discrete phases prior to being fed to the combiner. The phases of the N input signals are converted in a combiner control signal generator into Ns sets of digital control signals: one to control N sets of switches of first stage combiner, where the signals are selected according the phase and sent to the corresponding combiner in the M possible combiners, a second to control M switches of second stage combiner, a third to control the third stage combiner and so on. Each one combiner from the first stage combiner has N inputs or less. A second stage digital controlled combiner, with M inputs combines into two sub-sets of M/2 quadrature signals, the signals resulting from first stage and the resulting outputs of the combiner are then combined by a third combining digital controlled stage into the output signal. The signal amplifiers employed before the combining stage to generate the RF input signals may be Class D or Class F amplifiers to provide high efficiency on amplification.

In accordance with the present concepts, systems and techniques described herein, a multi stage digital controlled power combining system includes receiving the N signals with constant amplitude and discrete phases belonging to a alphabet with size M or M/2. In another embodiment this involves receiving the desired N input RF signals. In another embodiment this involves receiving the desired intermediate frequency (IF) signals. In another embodiment this involves receiving the envelope samples of the N input signals with discrete phases belonging to a alphabet with size M or M/2. Multi stage digital controlled power combining system also includes receiving a clock signal according to the signal frequency of the N input signals, receiving a clock signal according to the bandwidth of the N input signals and receiving a clock signal in accordance with the frequency of the desired output signal. The input signals are sampled in accordance with the sampling rate to generate the samples of the N input signals.

In accordance with the present concepts, systems and techniques described herein, a multi stage digital controlled power combining system includes the generation of digital control signals that includes detecting the N phases of the samples of the N input signals to map the N discrete phases, belonging to discrete and limited alphabet $\xi=\{\phi_0, \phi_1, \ldots, \phi_M\}$, into N sets of log 2(M) bits that correspond to the digital mapping of each phase and processing the N sets of log 2(M) bits to generate a set of N·M digital control signals that control the switches at the outputs of the N amplifiers, to generate one set of N·M/2 digital control signals and another set of N·M/4 digital control signals that control first stage combiners, second set of switches, second stage combiners and a third combiner stage.

In one embodiment, the generation of digital control signals in multi stage digital controlled power combining system includes processing the N sets of log 2(M) bits to generate a set of N·M digital control signals that control the switches at the inputs of the M combiners of first stage, to generate one set of N·M/2 digital control signals and another set of N·M/4 digital control signals that control a second stage of switches, a second combiner stage and a third combiner stage. It is important to note that in certain embodiments of the present invention the samples of baseband input signals could be directly converted into the set of N·M digital control signals and to generate a set of N·M/2 digital control signals and the set of N·M/4 digital control signals.

In one embodiment, the generation of digital control signals in multi stage digital controlled power combining system includes processing the N sets of log 2(M) bits to generate a set of N·M digital control signals that control the switches at the inputs of the M combiners of first stage, to generate one set of N·M/2 digital control signals that control a second stage of switches and a second combiner stage. It is important to note that in certain embodiments of the present invention the samples of baseband input signals could be directly converted into the set of N·M digital control signals and to generate a set of N·M/2 digital control signals and the set of N·M/4 digital control signals.

In accordance with the present concepts, systems and techniques described herein, a multi stage digital controlled power combining system includes processing the N input signals by multiplying these signals by a periodic pulse signal with the desired output signal frequency, individually amplifying each of one of the N signals and processing the outputs of the N amplifiers, using the N switch control signals to group the outputs of the amplifiers in sub-sets of signals with the same phase as inputs of each one of M combiners of the first stage of the multi stage combiner.

In one embodiment, the multi stage digital controlled power combining system includes processing the N RF input signals, using the N sets of digital control signals to group these signals in sub-sets of signals with the same phase that are the inputs of each one of M combiners of the first stage of the multi stage combiner.

In accordance with the present concepts, systems and techniques described herein, a multi stage digital controlled power combining system includes processing the outputs of the M combiners of the first stage, using the set of N·M digital control signals that controls the internal switches of the second combiner to combine sub-sets of signals in quadrature in the second stage of the multi-stage combiner. It also includes processing the M/2 outputs of the combiners of the second stage, using a set of M control signals that controls the internal switches of the third combiner to combine in the third stage of the multi stage combiner the sub-sets of signals that are in quadrature at the output of the second stage of the multi-stage combiner.

In one embodiment, the selection of the outputs of the M combiners of the first stage, is done using a set of N·M/2 digital control signals that controls the second switch and the second combiner to combine sub-sets of signals that are in quadrature in the second stage of the multi-stage combiner.

In accordance with the present concepts, systems and techniques described herein, a multi stage digital controlled power combining system includes a first stage with M reactive combiners having N or less input ports and an output port and N power amplifiers, each of the N power amplifiers having an input and an output, with the output of each power amplifier coupled to a digital controlled switch that select the respective input port of one of the M combiners, whose outputs are coupled to a second stage of reactive combiners, according the phase of each output. It should be mentioned that as used herein, the term "reactive combiner" refers to a combiner provided from circuit components that store or transfer energy, including inductors, capacitors, transformers, and transmission lines among other components.

In one embodiment, the multi stage digital controlled power combining system includes a first stage with M reactive combiners having N or less input ports and an output port and N RF signals coupled to a digital controlled switch that selects the respective input port of one of the M reactive combiners according the phase of the each input signal and the first set of digital control signals. According the digital control signals and the signals selected as inputs for each combiner, the combiners of each stage may be modeled with circuit elements having reactive impedance characteristics in a RF range of interest or as energy storage components or energy transfer components such that ideally there would be no loss. With this particular arrangement, the multi stage digital controlled power combining system described herein overcomes the loss and reactive loading problems of prior art outphasing systems. To achieve superior performance, it is necessary to consider the impedance characteristics of each portion of each combiner. It is important to mention that parallel combiners, in same stage, and cascaded combiners of different stages interact in a way that may change the effective admittance characteristics seen at the combiner inputs, and the performance of the multi stage combiner depends upon all sections of the combiner from the inputs to the output. Consequently, to achieve high performance, the reactance values (and similar characteristics) of all elements in the multi stage combiner are taken having into account in the digital control signals and the input signals applied to each combiner.

In accordance with a further aspect of the present concepts, systems and techniques described herein, a multi stage digital controlled power combining system includes a combiner provided from a plurality of stages of combiners elements and having a number of input ports that depends of the stage where each combiner is placed. In each stage each combiner has one or more reactive elements each having a specified reactance at an operating frequency or a specified range of reactance values over an operating frequency range. In some, embodiments the combiner is constructed as multiple stages, each one of the reactive elements in a given stage has a first specified reactance magnitude at the operating frequency. In some embodiments, the reactive elements within a stage may have the same reactance magnitude at the operating frequency while reactive elements in different stages may have a different reactance magnitude at the operating frequency.

In one embodiment, each of the N RF signal sources comprises an RF amplifier having an RF input port and an RF output port coupled to a respective one of the switches connected to the input ports of each combiner of the first stage power combiner with M reactive combiners.

In one embodiment, each of the N RF signal sources comprises an RF input signal coupled to a respective one of the switches connected to the input ports of each combiner of the first stage power combiner with M reactive combiners.

In one embodiment, each of the N RF signal sources comprises an RF signal coupled to a respective one of the switches connected to the input ports of each combiner of the first stage power combiner with M resistive combiners.

In one embodiment, the combiners of first stage include non-isolating combiners.

In one embodiment, the number of input ports of the first stage power combiners matches the number of RF signal sources.

In one embodiment, first stage power combiner comprises reactive elements having a first specified reactance magnitude at an operating frequency according, second stage and third stage combiners' reactive elements have a second and a third, different specified reactance magnitude at the operating frequency.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF DRAWINGS

The various aspects of embodiments disclosed here, including features and advantages of the present invention outlined above are described more fully below in the detailed description in conjunction with the drawings, where like reference numerals refer to like elements throughout, in which.

DETAILED DESCRIPTION OF THE INVENTION

Figure 1:
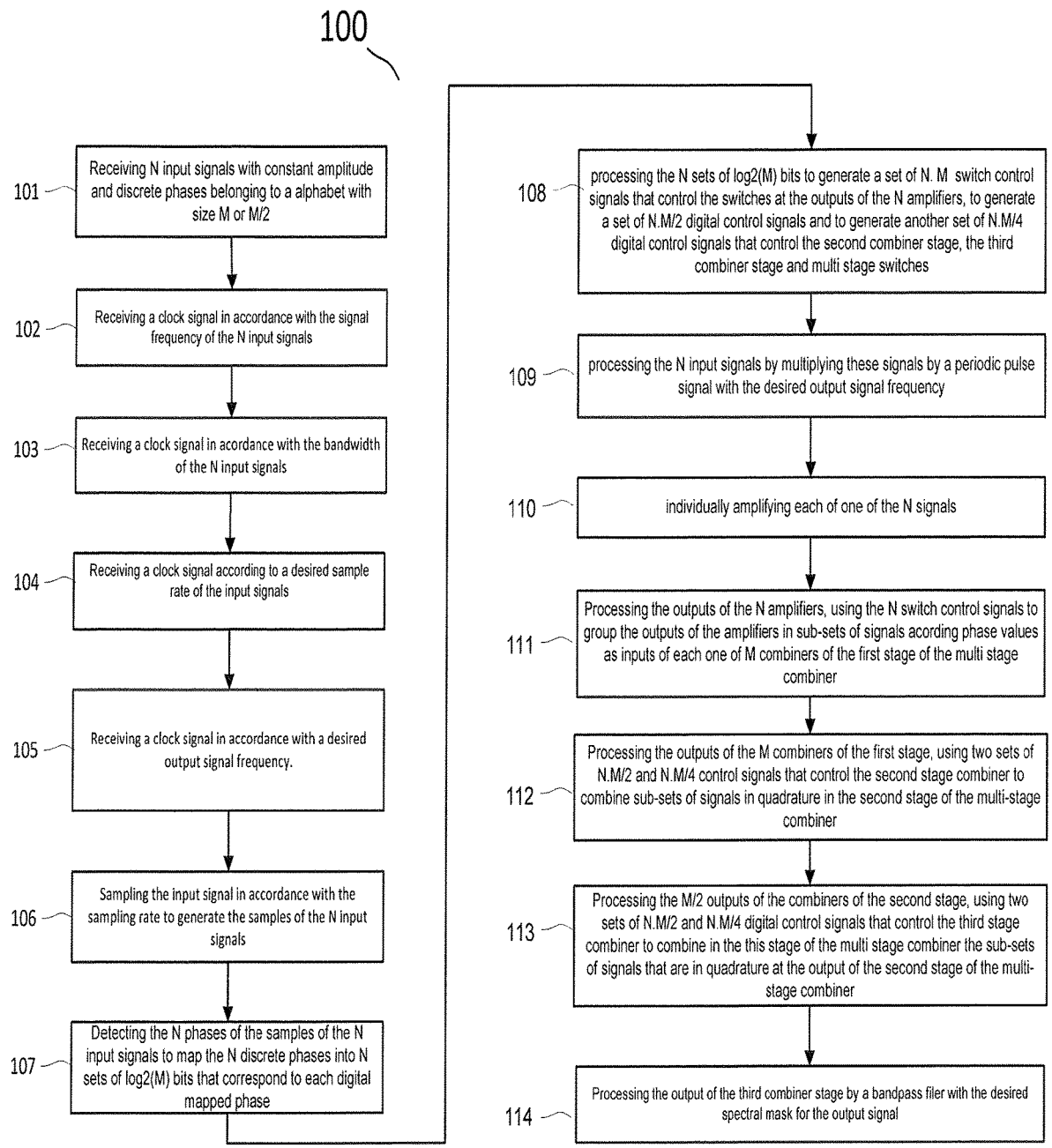
FIG. 1 is a process flowchart embodiment for power combing according to the digital controlled multi stage power combing method with N baseband input signals amplified by N parallel amplifiers.

In one embodiment, herein called digital controlled combiner with amplifiers (DCCA), N input constituent signals with constant amplitude and discrete phases belonging to an alphabet with M possible phases are received, individually amplified and combined according the discrete values of the phase of each constituent signal. In the DCCA embodiment the N input can be baseband signals or bandpass signals with in phase and quadrature components that are individually amplified. In another embodiment this involves receiving the time samples of the N desired input signals The operation of the DCCA embodiment shall be described further with reference to the flowchart of FIG. 1. Optional components are illustrated with dashed lines. The process starts at step 101, which includes receiving the N signals with constant amplitude and discrete phases belonging to an alphabet with size M or M/2. In another embodiment this involves receiving the desired N input RF signals. In another embodiment this involves receiving the desired intermediate frequency (IF) signals. In another embodiment this involves receiving the envelope samples of the N input signals with discrete phases belonging to an alphabet with size M or M/2.

Step 102 includes receiving a clock signal set according to the signal frequency of the N input signals.

Step 103 includes receiving a clock signal according to the bandwidth of the N input signals.

Step 104 includes receiving a clock signal according to a desired sample rate of the input signal. It is important to mention that as understood by a person skilled in the art the sample rate may vary according to the bandwidth of the input signal and the desired time resolution of the sampling process.

Step 105 includes receiving a clock signal in accordance with a desired output signal frequency.

Step 106 includes sampling the input signal in accordance with the sampling rate to generate the samples of the N input signals. In the embodiment example of FIG. 2, step 106 is implemented by a sampling circuit or a sample and hold (S/H) circuit.

Step 107 includes detecting the N phases of the samples of the N input signals to map the N discrete phases into N sets of log 2(M) bits that correspond to each digital mapped phase. As understood by a person skilled in the art based on the teaching herein, the step 107 can be performed by a block using a comparator and a look up table (LUT) with the corresponding bits for the discrete values of the phase.

Step 108 includes processing the N sets of log 2(M) bits to generate a set of N·M switch control signals that control the switches at the outputs of the N amplifiers, to generate a set of N·M/2 digital control signals and to generate another set of N·M/4 digital control signals that control the second combiner stage, the third combiner stage and multi stage switches. It is important to note that in certain embodiments of the present invention steps 106, 107 and 108 can be done once by a block that converts directly the samples into the N constant amplitude input signals into the set of N·M switch control signals and generates the sets of N·M/2 and N·M/4 digital control signals.

Step 109 includes processing the N input signals by multiplying these signals by a periodic pulse signal with the desired output signal frequency.

Step 110 includes individually amplifying each of one of the N signals.

Step 111 includes processing the outputs of the N amplifiers, using the N switch control signals to group the outputs of the amplifiers in sub-sets of signals with the same phase as inputs of each one of M combiners of the first stage of the multi stage combiner.

Step 112 includes processing the outputs of the M combiners of the first stage, using two sets of N·M/2 and N·M/4 control signals that control the second stage combiner to combine sub-sets of signals in quadrature in the second stage of the multi-stage combiner.

Step 113 includes processing the M/2 outputs of the combiners of the second stage, using two sets of N·M/2 and N·M/4 control signals that control the third stage combiner to combine in the third stage of the multi stage combiner the sub-sets of signals that are in quadrature at the output of the second stage of the multi-stage combiner.

Step 114 includes processing the output of the third combiner stage by a bandpass filer with the desired spectral mask for the output signal.

Figure 2A:
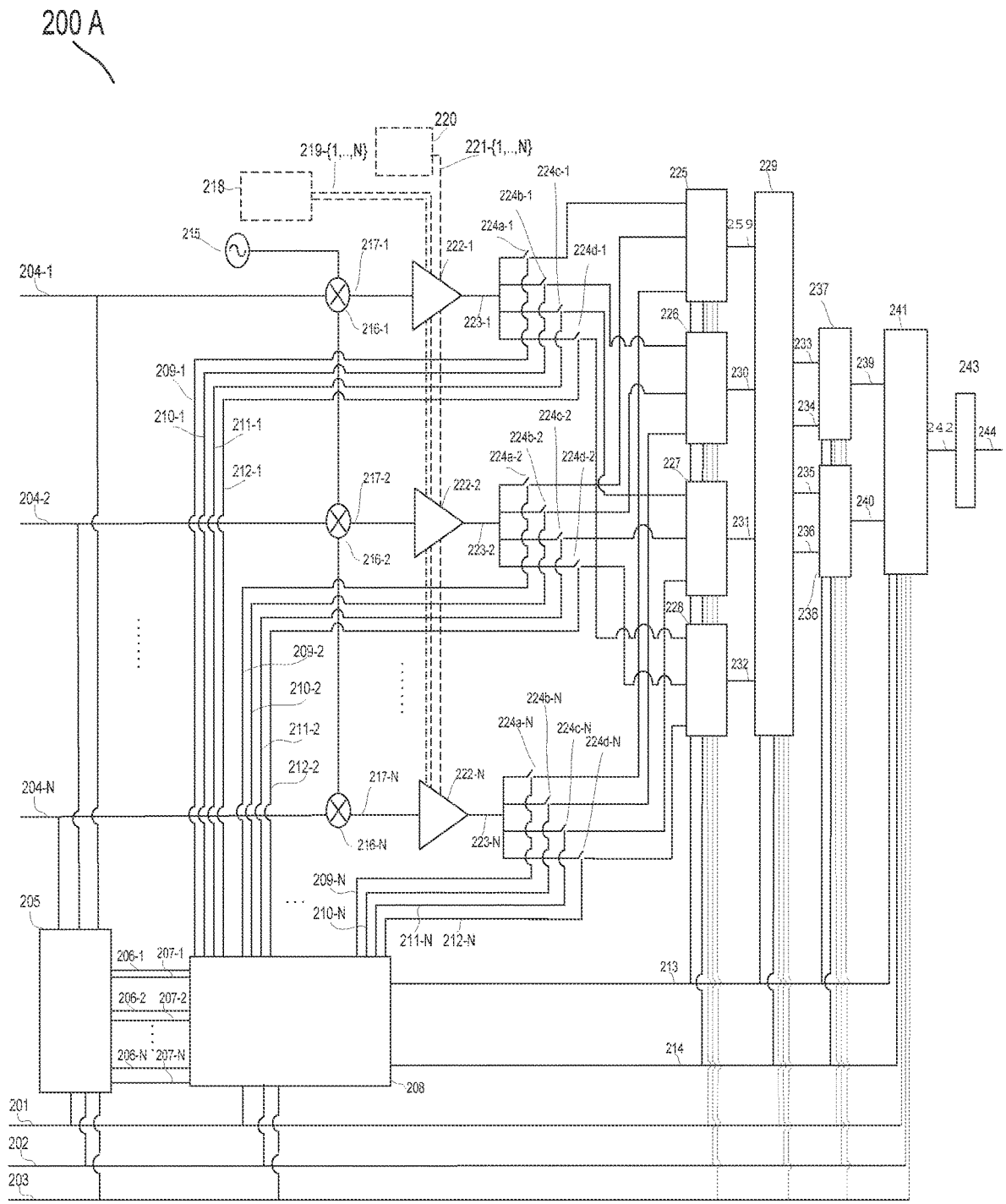
FIG. 2A is a block diagram that illustrates an exemplary embodiment of a multi stage power combing apparatus for implementing the digital controlled multi stage power combing method with input signals baseband signals with the discrete phase values taken at sample instants assuming four different values.

Block diagram 200A of FIG. 2A is an example that illustrates an exemplary embodiment implementing the process flowchart 100 of FIG. 1 with the discrete phases of the input signals belonging to an alphabet with M=4 possible values. In the example of FIG. 2A, optional components are illustrated with dashed lines. In other embodiments, additional components may be optional. In this example a clock reference signal 201 for the sampling process and a channel clock 202 for the RF signal, a clock signal 203 referring the bandwidth of the N input signals and N baseband signals 204-{1, . . . , N}, are received as inputs. In another embodiment the N baseband signals 204-{1, . . . , N} can be the samples of the baseband signals and the sample and hold block 201 is not required. In another embodiments signals 204-{1, . . . , N} can be baseband signals, or IF signals. It is noted that one alphabet with M=4 phases is employed in this embodiment only for purposes of illustration, and not limitation. The scope of the invention covers use of other discrete phase alphabet size, and implementation of such variations will be apparent to persons skilled in the art based on the teachings contained herein.

The clock reference signals 201 and 203 can be used by the block 205, by the digital signal control generator 208 and by the switches 224a-{1, . . . , N}, 224b-{1, . . . , N}, 224c-{1, . . . , N} and 224d-{1, . . . , N} and by the control signals 213 and 214 that control the first stage combiners 225, 226, 227 and 228, and controls the second stage switch, the second stage combiner 229 and third stage combiner 241. It can be understood by a person skilled in the art that the choice of the clock reference signal is made according the bandwidth of the input signals and the desired output signal.

The circuit 205 samples the N received signals according to the clock signals 201 and 203 and maps the discrete values of the phases of the N input signals into N sets of Log 2(M) bits. Still referring to FIG. 2A, the N sets of Log 2(M) bits are used in the digital combiner control signal generator block 208 to generate N sets of control switch signals 209-{1, . . . , N}, 210-{1, . . . , N}, 211-{1, . . . , N}, and 212-{1, . . . , N} and to generate the second stage and third stage digital control signals 213 and 214. The control signals 209-{1, . . . , N}, 210-{1, . . . , N}, 211-{1, . . . , N}, and 212-{1, . . . , N} are used to control a set of switches that selects which first stage combiner 225, 226, 227 and 228 could be used for each signal. The control signals 213, and 214 are provided to the second stage combiner 229 and a third stage combiner 241, respectively. Combiners 225, 226, 227 and 228 of first stage, combiner 229 of second stage and combiner 241 of third stage may use well known combining techniques such as active combiners or other techniques such as Wilkison, hybrid or transformers. or LC matching for a minimal power loss. According to digital control signals 213 and 214 and the signals selected as inputs for each combiner, the impedances of combiners in each stage may be modeled with circuit elements having reactive impedance characteristics or as energy storage components or energy transfer components. To achieve high performance, the reactance values and resistive values of all elements in the multi stage combiner are taken having into account in the digital control signals and the input signals applied to each combiner.

In another embodiment common clock signals 201 and 203 and digital control signals 213 and 214 are used to ensure that the outputs of first stage combiners 259, 230, 231 and 232 and the outputs of the second stage combiner 239 and 240 are time and frequency aligned.

The N input signals 217-{1, . . . , N} of the amplifiers 222-{1, . . . , N} are obtained by multiplying in 217-{1, . . . , N} the input signals 204-{1, . . . , N} by a pulse periodic signal with the desired frequency for the output signal generated by 215. The N input signals 217-{1, . . . , N} are the inputs of the corresponding power amplifiers (PAs) 222-{1, . . . , N} of the amplification stage that may be power amplifiers of class A, AB, and class C or switching power amplifiers of class D, class E, class F and sigma delta class S.

The outputs of PAs 223-{1, . . . , N} are grouped by first stage switch into 4 sets of signals with same phase according the digital control signals 209-{1, . . . , N}, 210-{1, . . . , N}, 211-{1, . . . , N}, and 212-{1, . . . , N} that delivers each one of the signals 223-{1, . . . , N} to the one of the combiners 225, 226, 227 and 228, according the phase value of each input signal. Assuming 4 discrete phases with possible values belonging to the alphabet $\{\pi/4, 3\pi/4, -3\pi/4, -\pi/4\}$, the set control signals of the switches selects the signals with phase $\pi/4$ as inputs for the combiner 225, selects the signals with phase $3\pi/4$ as inputs for the combiner 226, selects the signals with phase $-3\pi/4$ as inputs for the combiner 227 and selects the signals with phase $-\pi/4$ as inputs for the combiner 228. It is noted that 4 discrete phases are employed in this embodiment only for purposes of illustration, and not limitation. The scope of the invention covers use of other numbers of discrete phases with different values, and implementation of such variations will be apparent to persons skilled in the art based on the teachings contained herein.

The outputs 259, 230, 231 and 232 of the first stage combiners are the inputs the second stage switch whose outputs 233 and 234 are the inputs of second stage combiner composed by two quadrature combiners 237 and 238. The inputs in quadrature to be coupled in each combiner are selected according the digital control signals 213 and 214.

In the third stage combiner 241 the outputs of the second stage combiner are coupled together to obtain the desired output signal.

The third stage combiner's output signal 242 is submitted to a bandpass filter 243 with central frequency equal to the desired frequency of the output signal 244.

In another embodiment a bias circuit 218 can be employed to provide bias signals 219-{1, . . . , N} to the PAs. In another embodiment a phase control circuit 220 could be employed to generate control signals 221-{1, . . . , N} to compensate any phase shifts among amplifiers.

It is noted that 3 sets of digital control signals, 3 stages of combiners and two stages of switches are employed in this embodiment only for purposes of illustration, and not limitation. The scope of the invention covers the use of other numbers of digital control signals, numbers of combiners, combining rules and different number of stages of switches and implementation of such variations will be apparent to persons skilled in the art based on the teachings contained herein.

Figure 2B:
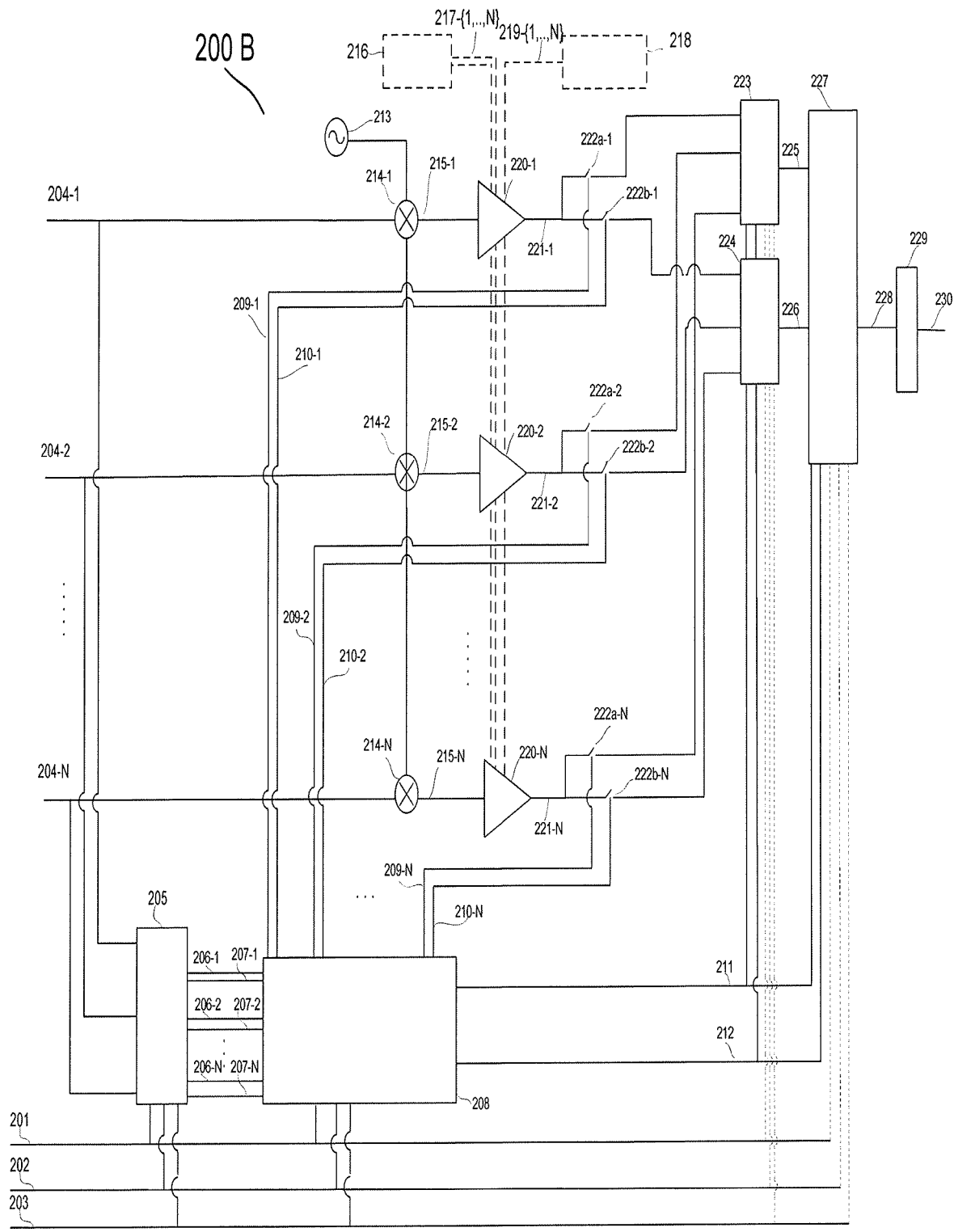
FIG. 2B is a block diagram that illustrates an exemplary embodiment of a multi stage power combing apparatus for implementing the digital controlled multi stage power combing method with input signals baseband signals with the discrete phase values taken at sample instants assuming two different values.

Block diagram 200B of FIG. 2B is an example that illustrates another embodiment implementing the process flowchart 100 of FIG. 1 with the discrete phases of the input signals belonging to an alphabet with M=2 possible values. In the example of FIG. 2B, optional components are illustrated with dashed lines. In other embodiments, additional components may be optional. In this example a clock reference signal 201 for the sampling process and a channel clock 202 for the RF signal, a clock signal 203 referring the bandwidth of the N input signals and N baseband signals 204-{1, . . . , N}, are received as inputs. In another embodiment the N baseband signals 204-{1, . . . , N} can be the samples of the baseband signals and a sample and hold in block 205 is not required. In another embodiments signals 204-{1, . . . , N} can be baseband signals, or IF signals. It is noted that one alphabet with M=4 phases is employed in this embodiment only for purposes of illustration, and not limitation. The scope of the invention covers use of other discrete phase alphabet size, and implementation of such variations will be apparent to persons skilled in the art based on the teachings contained herein.

The clock reference signals 201 and 203 can be used by the block 205, by the digital signal control generator 208, by the switches 222a-{1, . . . , N} and 222b-{1, . . . , N}, and by the digital control signals 211 and 212 that control the first stage combiners 223 and 224, and second stage combiner 227. It can be understood by a person skilled in the art that the choice of the clock reference signal is made according the bandwidth of the input signals and the desired output signal.

The circuit 205 samples the N received signals according to the clock signals 201 and 203 and maps the discrete values of the phases of the N input signals into N sets of Log 2(M) bits. Still referring to FIG. 2B, the N sets of Log 2(M)

bits are used in the digital control signal generator block 208 to generate N sets of digital control signals 209-$\{1, \ldots, N\}$ and 210-$\{1, \ldots, N\}$ and to generate the digital control signals 211 and 212. The digital control signals 209-$\{1, \ldots, N\}$ and 210-$\{1, \ldots, N\}$ are used to control a set of switches that selects which first stage combiner 223 and 224, could be used for each signal. The digital control signals 211 and 212 are provided to the first stage combiners 223 and 224 and provided to the second stage combiner 227, respectively. Combiners 223 and 224 of first stage and combiner 227 of second stage may use well known combining techniques such as active combiners or other techniques such as Wilkison, hybrid or transformers. or LC matching for a minimal power loss.

According to digital control signals 211 and 212 and the signals selected as inputs for each combiner, the impedances of combiners in each stage may be modeled with circuit elements having reactive impedance characteristics or as energy storage components or energy transfer components. To achieve high performance, the reactance values and resistive values of all elements in the multi stage combiner are taken having into account in the digital control signals and the input signals applied to each combiner.

In another embodiment, common clock signals 201 and 203 are used to ensure that the outputs of first stage combiners 223 and 224 and the output of the second stage combiner 227 are time and frequency aligned.

The N input signals 215-$\{1, \ldots, N\}$ of the amplifiers 220-$\{1, \ldots, N\}$ are obtained by multiplying in 214-$\{1, \ldots, N\}$ the input signals 204-$\{1, \ldots, N\}$ by a pulse periodic signal with the desired frequency for the output signal generated by 213. The N input signals 217-$\{1, \ldots, N\}$ are the inputs of the corresponding PAs 220-$\{1, \ldots, N\}$ of the amplification stage that may be power amplifiers of class A, AB, and class C or switching power amplifiers of class D, class E, class F and sigma delta class S.

The outputs of PAs 221-$\{1, \ldots, N\}$ are grouped by first stage switches 222a-$\{1, \ldots, N\}$ and 222b-$\{1, \ldots, n\}$, into 2 sets of signals with same phase according the digital control signals 209-$\{1, \ldots, N\}$ and 210-$\{1, \ldots, N\}$, and delivers each one of the signals 221-$\{1, \ldots, N\}$ to one of the combiners 223 and 224, according the phase value of each input signal and the digital control signals. For 2 discrete phases with possible values belonging to the alphabet $\{\pi/4, 3\pi/4\}$, the set of digital control signals of the switches selects the signals with phase $\pi/4$ as inputs for the combiner 223, and selects the signals with phase $3\pi/4$ as inputs for the combiner 224. It is noted that 2 discrete phases belonging to the alphabet $\{\pi/4, 3\pi/4\}$ are employed in this embodiment only for purposes of illustration, and not limitation. The scope of the invention covers use of other phase alphabets other numbers of discrete phases, and implementation of such variations will be apparent to persons skilled in the art based on the teachings contained herein.

The outputs 225 and 226 of the first stage combiner are the inputs the second stage combiner. The second stage combiner's output signal 228 is submitted to a bandpass filter 229 with central frequency equal to the desired frequency of the output signal 230.

In another embodiment a bias circuit 216 can be employed to provide bias signals 217-$\{1, \ldots, N\}$ to the PAs. In another embodiment a phase control circuit 218 could be employed to generate control signals 219-$\{1, \ldots, N\}$ to compensate any phase shifts among amplifiers.

In another embodiment, herein called digital controlled combiner (DCC), N input RF signals and the corresponding baseband signals with discrete phases belonging to an alphabet with M possible phases are received, being combined the N RF input signals according the discrete values of the phase of the corresponding baseband signal. In other DCC embodiments the N inputs can be bandpass signals with in phase and quadrature components and the corresponding baseband signals can be replaced by the digital information about the phases of each one of baseband signal.

Figure 3:
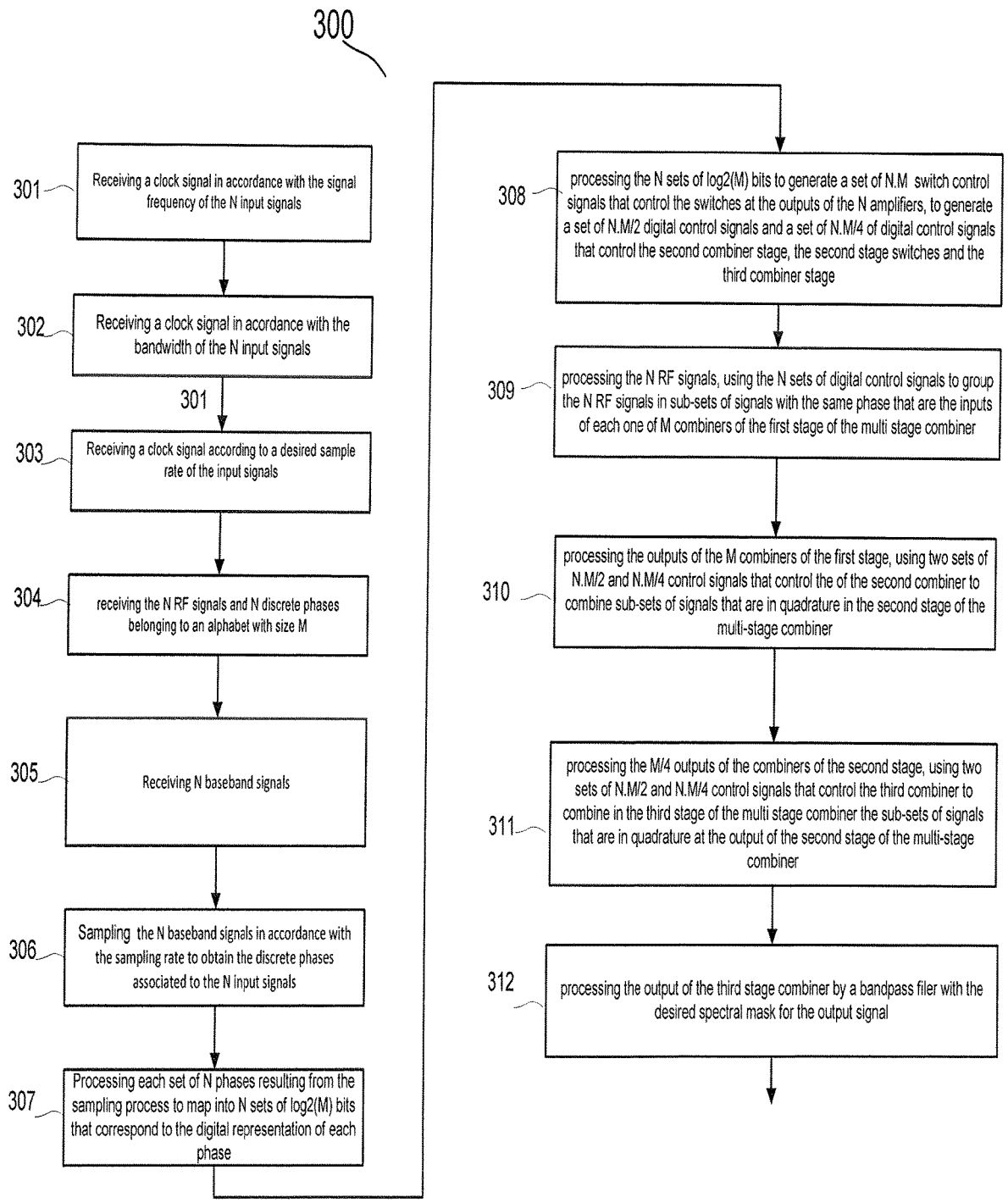
FIG. 3 is a process flowchart embodiment of digital controlled multi stage power combing method with N bandpass signals resulting from the outputs of N parallel amplifiers.

The operation of the DCC embodiment shall be described further with reference to the flowchart of FIG. 3. Optional components are illustrated with dashed lines.

The process starts at step 301, which includes receiving the N RF signals and N discrete phases belonging to an alphabet with size M.

The process starts at step 301 which includes receiving a clock signal set according to the signal frequency of the N input signals.

Step 302 includes receiving a clock signal according to the bandwidth of the N input signals.

Step 303 includes receiving a clock signal set according to a desired sample rate of the input signal. It is important to mention that as understood by a person skilled in the art the sample rate may vary according to the bandwidth of the input signal and the desired time resolution of the sampling process.

Step 304 includes receiving the N RF signals and N discrete phases belonging to an alphabet with size M.

Step 305 includes receiving the N baseband signals.

Step 306 includes sampling the N baseband signals in accordance with the sampling rate to obtain the discrete phases associated to the N input signals. In the embodiment example of FIG. 4A, step 306 is implemented by a sampling circuit or a sample and hold (S/H) circuit in block 405.

Step 307 includes processing each set of N phases resulting from the sampling process to map into N sets of log 2(M) bits that correspond to the digital representation of each phase. As understood by a person skilled in the art based on the teaching herein, the step 307 can be performed by a block using a comparator and a LUT with the corresponding bits for the discrete values of the phase.

Step 308 includes processing the N sets of log 2(M) bits to generate a set of N·M switch control signals that control the switches at the outputs of the N amplifiers, to generate a set of N·M/2 digital control signals and a set of N·M/4 of digital control signals that control the second combiner stage, the second stage switches and the third combiner stage. It is important to note that in certain embodiments of the present invention steps 306, 307 and 308 can be done once by a block that converts directly the samples of baseband input signals into the set of N·M switch control signals and generates the set of N·M/2 control signals for the internal switches of the second combiner stage and the set of N·M/4 that controls the internal switches of the third combiner stage.

Step 309 includes processing the N RF signals, using the N sets of digital control signals to group the N RF signals in sub-sets of signals with the same phase that are the inputs of each one of M combiners of the first stage of the multi stage combiner.

Step 310 includes processing the outputs of the M combiners of the first stage, using two sets of N·M/2 and N·M/4 control signals that control the of the second combiner to combine sub-sets of signals that are in quadrature in the second stage of the multi-stage combiner.

Step 311 includes processing the M/4 outputs of the combiners of the second stage, using two sets of N·M/2 and N·M/4 control signals that control the third combiner to combine in the third stage of the multi stage combiner the sub-sets of signals that are in quadrature at the output of the second stage of the multi-stage combiner.

Step 312 includes processing the output of the third stage combiner by a bandpass filer with the desired spectral mask for the output signal.

It is noted that 3 sets of digital control signals, 3 stages of combiners and two stages of switches are employed in this embodiment only for purposes of illustration, and not limitation. The scope of the invention covers the use of other numbers of digital control signals, numbers of combiners, combining rules and different number of stages of switches and implementation of such variations will be apparent to persons skilled in the art based on the teachings contained herein.

Figure 4A:
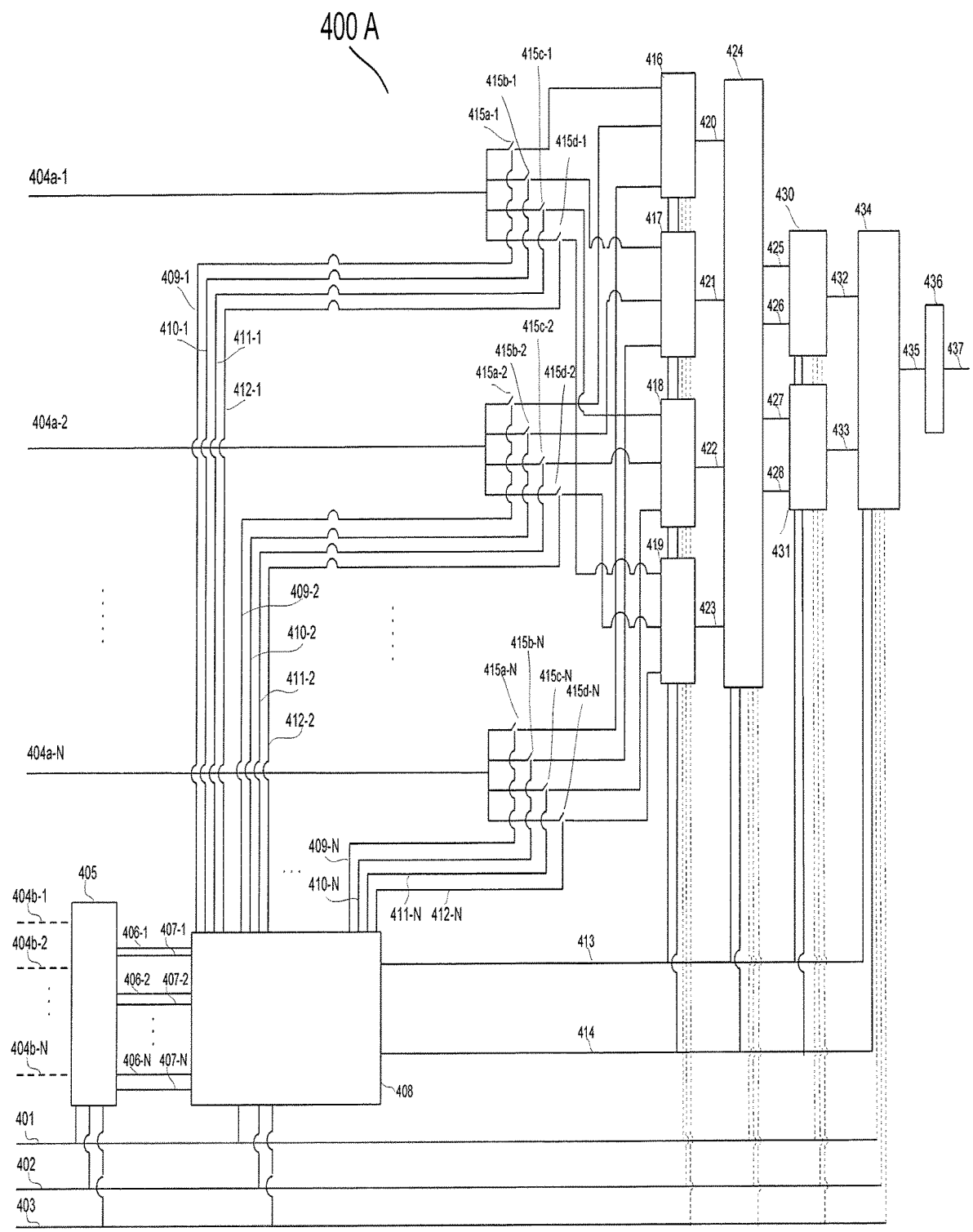
FIG. 4A is a block diagram that illustrates an exemplary embodiment of a multi stage power combining apparatus for implementing the digital controlled multi stage power combing method with N input bandpass signals or RF signals with the discrete phase values taken at sample instants assuming four different values.

Block diagram 400A of FIG. 4A is an example that illustrates an exemplary embodiment implementing the process flowchart 300 of FIG. 3 with the discrete phases of the input signals belonging to an alphabet with M=4 possible values and 3 combining stages. In the example of FIG. 4A, optional components are illustrated with dashed lines. In other embodiments, additional components may be optional. In this embodiment a clock reference signal 401 for the sampling process and a channel clock 402 for the RF signal, a clock signal 403 referring the bandwidth of the N input signals, N RF signals 404a-{1, . . . , N}, and N baseband signals 404b-{1, . . . , N}, are received as inputs. In another embodiment the N baseband signals 404a-{1, . . . , N} can be the samples of the baseband signals or the samples of the phases of the N baseband signals. In another embodiment signals 404a-{1, . . . , N} can be IF signals. It is noted that one alphabet with M=4 phases, 3 sets of digital control signals, 3 stages of combiners and two stages of switches are employed in this embodiment only for purposes of illustration, and not limitation. The scope of the invention covers use of other discrete phase alphabet size, and implementation of such variations will be apparent to persons skilled in the art based on the teachings contained herein.

The clock reference signals 401 and 403 can be used by the block 405, by the digital signal control generator 408 and by the switches 415a-{1, . . . , N}, 415b-{1, . . . , N}, 4165c-{1, . . . , N} and 415d-{1, . . . , N} and by the control signals 413 and 414 that control the first stage combiners 416, 417, 418 and 419, second stage switch 424, second stage combiners 430 and 431, and third stage combiner 434. It can be understood by a person skilled in the art that the choice of the clock reference signal is made according the bandwidth of the input signals and the desired output signal.

The circuit 405 samples the N received baseband signals according to the clock signals 401 and 403 and maps the discrete values of the phases of the N input signals into N sets of Log 2(M) bits 406-{1, . . . , N} and 407-{1, . . . , N}. Still referring to FIG. 4A, the N sets of Log 2(M) bits are used in the digital combiner control signal generator block 408 to generate N sets of control switch signals 409-{1, . . . , N}, 410-{1, . . . , N}, 411-{1, . . . , N} and 412-{1, . . . , N} and to generate the digital control signals 413 and 414. The digital control signals 409-{1, . . . , N}, 410-{1, . . . , N}, 411-{1, . . . , N} and 412-{1, . . . , N} are used to control a set of switches that selects which first stage combiner 416, 417, 418 and 419 could be used for each signal. The control signals 413 and 414 are provided to the second stage switch 424, second stage combiners 430 and 431 and to the third stage combiner 434. Combiners 416, 417, 418 and 419 of first stage, combiners 430 and 431 of second stage and combiner 434 of third stage may use well known combining techniques such as active combiners or other techniques such as Wilkinson, hybrid or transformers or LC matching for a minimal power loss.

According to digital control signals 413 and 414 and the signals selected as inputs for each combiner, the impedances of combiners in each stage may be modeled with circuit elements having reactive impedance characteristics or as energy storage components or energy transfer components. To achieve high performance, the reactance values and resistive values of all elements in the multi stage combiner are taken having into account in the digital control signals and the input signals applied to each combiner.

In an embodiment common clock signals 401 and 403 are used to ensure that the outputs of first stage combiners 420, 421, 422 and 423 and the outputs of the second stage combiner 430 and 431 are time and frequency aligned.

In an embodiment digital control signals 413 and 414 are used to ensure that the outputs of first stage combiners 420, 421, 422 and 423 and the outputs of the second stage combiner 430 and 431 are time and frequency aligned.

The N input RF signals 404a-{1, . . . , N} are obtained from the outputs of N PAs from an amplification stage where PAs may be power amplifiers of class A, AB, and class C or switching power amplifiers of class D, class E, class F and sigma delta class S.

The N input RF signals 404-{1, . . . , N} are grouped by the switches 415a-{1, . . . , N}, 415b-{1, . . . , N}, 415c-{1, . . . , N} and 415d-{1, . . . , N} into 4 sets of signals with same phase according the digital control signals 409-{1, . . . , N}, 410-{1, . . . , N}, 411-{1, . . . , N} and 412-{1, . . . , N}, that delivers each one of the signals to one of the combiners 416, 417, 418 and 419, according the phase value of each input signal and the digital control signals 413 and 414. Assuming 4 discrete phases with possible values belonging to the alphabet {π/4, 3π/4, −3π/4, −π/4}, the set control signals of the switches selects the signals with phase π/4 as inputs for the combiner 416, selects the signals with phase 3π/4 as inputs for the combiner 417, selects the signals with phase −3π/4 as inputs for the combiner 418 and selects the signals with phase −π/4 as inputs for the combiner 419. It is noted that 4 discrete phases are employed in this embodiment only for purposes of illustration, and not limitation. The scope of the invention covers use of other numbers of discrete phases, and implementation of such variations will be apparent to persons skilled in the art based on the teachings contained herein.

The outputs 420, 421, 422 and 423 of the first stage combiner are the inputs the second stage combiner composed by at least two combiners. The inputs to be coupled in each combiner are selected according the digital control signals 413 and 414.

In the third stage combiner 434 the outputs of the second stage combiner are coupled together to obtain the desired output signal.

The third stage combiner's output signal 435 is submitted to a bandpass filter 436 with central frequency equal to the desired frequency of the output signal 437.

It is noted that 3 sets of digital control signals, 3 stages of combiners and two stages of switches are employed in this embodiment only for purposes of illustration, and not limitation. The scope of the invention covers the use of other numbers of digital control signals, numbers of combiners, and different number of stages of switches and implementation of such variations will be apparent to persons skilled in the art based on the teachings contained herein.

Figure 4B:
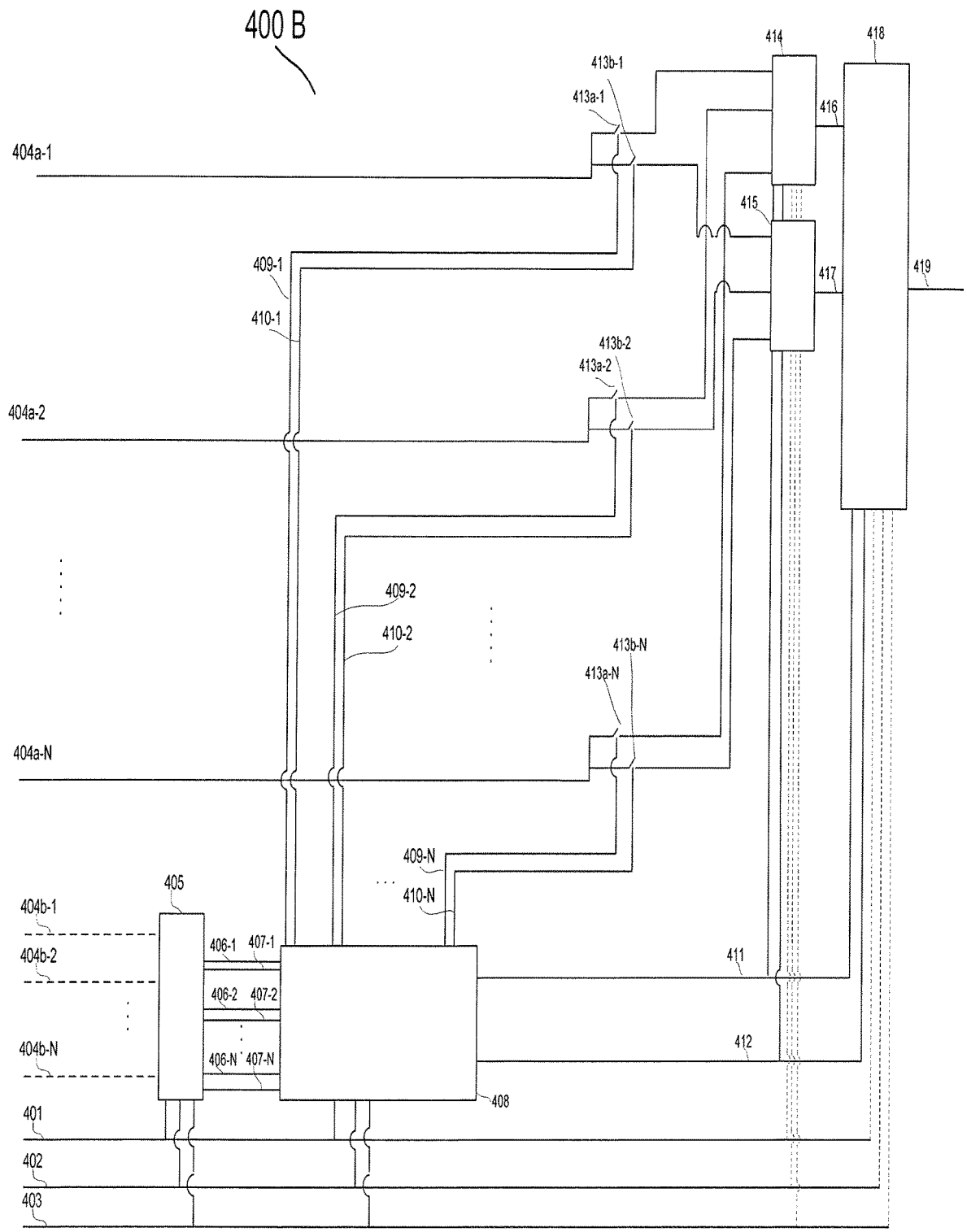
FIG. 4B is a block diagram that illustrates an exemplary embodiment of a multi stage power combining apparatus for implementing the digital controlled multi stage power combing method with N input signals bandpass or RF signals with discrete phase values taken at sample instants assuming two different values.

Block diagram 400B of FIG. 4B is an example that illustrates another embodiment implementing the process flowchart 300 of FIG. 3 with the discrete phases of the input signals belonging to an alphabet with M=2 possible values. In the example of FIG. 2B, optional components are illustrated with dashed lines. In other embodiments, additional components may be optional. In this example a clock reference signal 401 for the sampling process and a channel clock 402 for the RF signal, a clock signal 403 referring the bandwidth of the N input signals, N RF signals 404a-{1, ..., N}, and N baseband signals 404b-{1, ..., N}, are received as inputs. In another embodiment the N baseband signals 404b-{1, ..., N} can be the samples of the baseband signals or the samples of the phases of the N baseband signals. In another embodiment, signals 404b-{1, ..., N} can be IF signals. It is noted that one alphabet with M=2 phases and two combining stages are employed in this embodiment only for purposes of illustration, and not limitation. The scope of the invention covers use of other discrete phase alphabet size, and implementation of such variations will be apparent to persons skilled in the art based on the teachings contained herein.

The clock reference signals 401 and 403 can be used by the block 405, by the digital signal control generator 408 and by the switches 413a-{1, ..., N} and 413b-{1, ..., N} and by the control signals 411 and 412 that control the first stage combiners 416 and 415, and controls the second stage combiner 418. It can be understood by a person skilled in the art that the choice of the clock reference signal is made according the bandwidth of the input signals and the desired output signal.

The block 405 samples the N received baseband signals according to the clock signals 401 and 403 and maps the discrete values of the phases of the N input signals into N sets of Log 2(M) bits 406-{1, ..., N} and 407-{1, ..., N}. Still referring to FIG. 4B, the N sets of Log 2(M) bits are used in the digital control signal generator block 408 to generate N sets of control switch signals 409-{1, ..., N} and 410-{1, ..., N}, and to generate digital control signals 411 and 412. The control signals 409-{1, ..., N} and 410-{1, ..., N} are used to control the inputs of first stage combiners 414 and 415. The digital control signals 411 and 412 are provided to the first stage combiners 416 and 415 and to the second stage combiner 418. Combiners 414 and 415 of first stage and combiner 418 of second stage may use well known combining techniques such as active combiners or other techniques such as Wilkinson, hybrid or transformers, or LC matching for a minimal power loss. According to digital control signals 411 and 412 and the signals selected as inputs for each combiner, the impedances of combiners in each stage may be modeled with circuit elements having reactive impedance characteristics or as energy storage components or energy transfer components. To achieve high performance, the reactance values and resistive values of all elements in the multi stage combiner are taken having into account in the digital control signals and the input signals applied to each combiner.

In an embodiment common clock signals 401 and 403 are used to ensure that the outputs of first stage combiners 414 and 414 and the output of the second stage combiner 418 are time and frequency aligned.

The N input RF signals 404a-{1, ..., N} are obtained from the outputs of N PAs from an amplification stage where PAs may be power amplifiers of class A, AB, and class C or switching power amplifiers of class D, class E, class F and sigma delta class S.

The N input RF signals 404a-{1, ..., N} are grouped by the switches 413a-{1, ..., N} and 413b-{1, ..., N} into 2 sets of signals with same phase according the control switch signals 409-{1, ..., N} and 410-{1, ..., N}, that delivers each one of the signals to one of the combiners 414 and 415, according the phase value of each input signal. Assuming 2 discrete phases with possible values belonging to the alphabet {π/4, 3π/4}, the set control signals of the switches selects the signals with phase π/4 as inputs for the combiner 414 and selects the signals with phase 3π/4 as inputs for the combiner 415. It is noted that 2 discrete phases are employed in this embodiment only for purposes of illustration, and not limitation. The scope of the invention covers use of other numbers of discrete phases and values, and implementation of such variations will be apparent to persons skilled in the art based on the teachings contained herein.

The outputs 416 and 417 of the first stage combiner are the inputs the second stage combiner 418. In the second stage combiner the inputs in quadrature to be coupled together according digital control signals 411 and 412.

The second stage combiner's output signal 419 is submitted to a bandpass filter 420 with central frequency equal to the desired frequency of the output signal 421.

While preferred embodiments of the present disclosure have been described above, the present disclosure is not limited to the specific configurations described above. Various variations and modifications may be made without departing from the scope of the present disclosure. It should be understood by those skilled in the art that various modifications, combinations, sub-combinations and alterations may occur depending on design requirements and other factors insofar as they are within the scope of the appended claims or the equivalents thereof.

What is claimed is:

1. A digital controlled multi-stage signal combiner, comprising:
   a plurality of N inputs receiving respective radio frequency (RF) or intermediate (IF) input signals, each of the inputs having a respective input impedance and a discrete phase value belonging to a finite alphabet of M possible phase values, or the plurality of N inputs receiving respective baseband input signals, each of the input signals having constant amplitude and a discrete phase value belonging to the finite alphabet of M possible phase values;
   a plurality of K stages of digital controlled electrical switches, each of the switches of each of the K stages having an output;
   signal combiners having inputs electrically and selectively connected to the outputs of certain switches among the K stages,
   where the Kth stage has at least $M/2^{(K-1)}$ signal combiners electrically and selectively connected to the switches of the Kth stage or the signal combiners of the (K−1)th stage;
   a phase digital mapper receiving the N respective baseband input signals, and converting the discrete phase values of the N inputs into at least 2N sets of log 2(M) bits; and
   a digital signal control generator receiving the at least 2N sets of log 2(M) bits and converting each of the 2N sets into at least two sets of digital control signals with (N×M) and (N×M/2) control bits in the first two stages that control the switches and the signal combiners in the K stages, by selecting the signals to be combined in each combiner and the impedance of each combiner in each stage according to the selected signals and the digital control signals supplied by the digital signal control generator.

2. The digital controlled multi stage signal combiner as set forth in claim 1, further including K=3 stages comprising:
    first stage switches with N×M inputs and M outputs each having an output impedance electrically connected to one of the M first stage signal combiners;
    second stage switches with M inputs and M outputs each having an output impedance electrically connected to one of M/2 second stage signal combiners; and
    at least M/4 third stage signal combiners being electrically and selectively connected to outputs of the second stage combiners.

3. The digital controlled multi stage signal combiner as set forth in claim 1, further including K=2 stages comprising:
    first stage switches with N×M inputs and M outputs each having an output impedance electrically connected to one of M first stage signal combiners; and
    at least M/2 second stage signal combiners being electrically and selectively connected to outputs of the first stage signal combiners.

4. The digital controlled multi stage signal combiner as set forth in claim 1, further including K=3 stages wherein:
    each first stage signal combiner has at least N inputs being electrically and selectively connected to the outputs of the first stage switches;
    each second stage signal combiner has at least M/2 inputs being electrically and selectively connected to the outputs of the second stage switches; and
    each third stage signal combiner has at least M/2 inputs being electrically and selectively connected to outputs of the second stage combiners.

5. The digital controlled multi stage signal combiner as set forth in claim 1, further including K=2 stages wherein:
    each first stage signal combiner has at least N inputs being electrically and selectively connected to the outputs of the first stage switches; and
    each second stage signal combiner has at least M inputs being electrically and selectively connected to outputs of the first stage combiners.

6. The digital controlled multi stage signal combiner as set forth in claim 1, wherein the respective impedances of the inputs of the signal combiners of each stage are determined as a function of a number of the inputs and the digital control signals.

7. The digital controlled multi stage signal combiner as set forth in claim 1, further including:
    a first stage switch with a plurality of ground switches for selectively switching the respective inputs between a signal source and the ground; and
    a control circuit for selectively controlling the first stage switch.

8. The digital controlled multi stage signal combiner as set forth in claim 1, further comprising:
    a second stage switch with a plurality of ground switches for selectively switching the respective inputs between a signal source and the ground; and
    a control circuit for selectively controlling the second stage switch.

9. The digital controlled multi stage signal combiner as set forth in claim 1, further comprising:
    a third stage switch with a plurality of ground switches for selectively switching the respective inputs between a signal source and the ground; and
    a control circuit for selectively controlling the third stage switch.

10. The digital controlled multi stage signal combiner as set forth in claim 1, further comprising:
    a plurality of second stage signal combiners for selectively combining the respective inputs according to the digital control signals provided by the digital signal control generator; and
    a control circuit for selectively controlling the impedance of each signal combiner in the second stage combiners.

11. The digital controlled multi stage signal combiner as set forth in claim 1, further comprising:
    a plurality of third stage combiners for selectively combining the respective inputs according to the digital control signals provided by the digital signal control generator; and
    a control circuit for selectively controlling the impedance of each signal combiner in the third stage combiners.

12. The digital controlled multi stage signal combiner as set forth in claim 1, wherein the signal source includes respective amplifiers electrically connected to the inputs.

13. The digital controlled multi stage signal combiner as set forth in claim 1, wherein the signal source consists of RF signals connected to the N inputs.

14. The digital controlled multi stage signal combiner as set forth in claim 1, further comprising:
    an electrical connection point electrically connected to the inputs and to the first stage switches.

15. The digital controlled multi stage signal combiner as set forth in claim 1, wherein the plurality of N inputs receiving the respective baseband input signals includes digital baseband input signals, with digital representation of the discrete phase values belonging to the finite alphabet of the M possible phase values.

16. The digital controlled multi stage signal combiner as set forth in claim 1, wherein:
    the signal combiners at each stage of the multi stage signal combiner have a plurality of inputs receiving respective input signals, each of the inputs having a respective input impedance;
    the signal combiners at each stage of the multi stage signal combiner have respective equivalent impedances being determined as a function of a number of inputs forming the input signals and the digital control signals provided by the digital signal control generator; and
    the signal combiners at each stage of the multi stage signal combiner each have an output, having an output impedance and an output signal, which is formed as a function of the combiner input signals, the output signal digital control signals provided by the digital signal control generator.

* * * * *